United States Patent
Ishihara

(10) Patent No.: US 7,838,983 B2
(45) Date of Patent: *Nov. 23, 2010

(54) PACKAGED SEMICONDUCTOR DEVICE AND METHOD OF MANUFACTURING THE PACKAGED SEMICONDUCTOR DEVICE

(75) Inventor: Masamichi Ishihara, Kitakyushu (JP)

(73) Assignee: Kyushu Institute of Technology, Fukuoka (JP)

( * ) Notice: Subject to any disclaimer, the term of this patent is extended or adjusted under 35 U.S.C. 154(b) by 305 days.

This patent is subject to a terminal disclaimer.

(21) Appl. No.: 11/911,990
(22) PCT Filed: Apr. 4, 2006
(86) PCT No.: PCT/JP2006/307087
§ 371 (c)(1),
(2), (4) Date: Oct. 19, 2007
(87) PCT Pub. No.: WO2006/117961
PCT Pub. Date: Sep. 11, 2006

(65) Prior Publication Data
US 2009/0140364 A1    Jun. 4, 2009

(30) Foreign Application Priority Data
Apr. 26, 2005    (JP) .............................. 2005-127266

(51) Int. Cl.
H01L 23/12    (2006.01)
(52) U.S. Cl. ................. 257/701; 438/106; 438/107; 438/109; 438/110; 438/113; 438/114; 438/455; 438/460; 438/596; 438/639; 257/678; 257/683; 257/684; 257/685; 257/686; 257/690; 257/698; 257/E21.166; 257/E21.167; 257/E31.117
(58) Field of Classification Search ........... 257/434, 257/E31.117, 666–798, E23.133, E21.166, 257/E21.167; 438/112, 597, 106, 107, 109, 438/110, 113, 114, 455, 456, 460–465, 596, 438/639
See application file for complete search history.

(56) References Cited

U.S. PATENT DOCUMENTS

| | | | |
|---|---|---|---|
| 5,847,930 A * | 12/1998 | Kazle | 361/736 |
| 7,022,552 B2 * | 4/2006 | Yamaguchi | 438/113 |
| 2004/0257748 A1 * | 12/2004 | Ritter et al. | 361/306.3 |
| 2005/0017338 A1 * | 1/2005 | Fukazawa | 257/686 |
| 2005/0067680 A1 * | 3/2005 | Boon et al. | 257/678 |
| 2005/0263873 A1 * | 12/2005 | Shoji | 257/698 |

FOREIGN PATENT DOCUMENTS

| | | | |
|---|---|---|---|
| JP | 10294018 A | * | 11/1998 |
| JP | 2002075999 | | 3/2002 |
| JP | 2004303884 | | 10/2004 |
| JP | 2004342883 | | 12/2004 |
| JP | 2005005488 | | 1/2005 |

OTHER PUBLICATIONS

Kaydanova, T.; Direct Write Contact for Solar Cells; Photovoltaic Specialists Conference, 2005. Conference Record of the Thirty-first IEEE; Jan. 3-7, 2005; p. 1305-1308.*

* cited by examiner

*Primary Examiner*—Fernando L Toledo
*Assistant Examiner*—John P Dulka
(74) *Attorney, Agent, or Firm*—McGlew and Tuttle, P.C.

(57) ABSTRACT

The present invention connects a first wiring portion located at one side of a substrate and a second wiring portion located at the other side. A side electrode connected to the first wiring portion is formed, and the second wiring portion is formed on an insulating layer formed on the substrate. An exposed end of the second wiring portion formed when singulated into individual semiconductor package and the side electrode are wired by ink jet system using nano metal particles. Particularly, when copper is used, the wiring by the ink jet system is performed by the reduction of a metal surface oxidation film and/or removal of organic matters by atomic hydrogen.

4 Claims, 14 Drawing Sheets

COMPLETION VIEW AFTER WIRING APPLIED ON SIDE SURFACE

CHIP TOP VIEW

SIDE VIEW

CHIP BACK VIEW

SIDE VIEW

CHIP CUT OUT AFTER HALF CUTTING

COMPLETION VIEW AFTER WIRING APPLIED ON SIDE SURFACE

CHIP CUT OUT WITHOUT HALF CUTTING

INSULATE WHOLE CUT SURFACE OF SUBSTRATE

PARTIALLY INSULATE SUBSTRATE SIDE SURFACE BY INKJET

SIDE SURFACE WIRING ON INSULATING FILM

LEAD FRAME TYPE DOUBLE SIDED ELECTRODE PACKAGE

AFTER MOLD ARRAY PACKAGE

AFTER CUTTING OUT ONE PIECE
(ENLARGED)

WIRING BY INKJET
BUMP ELECTRODE
LEAD FRAME END SURFACE (SIDE ELECTRODE)

WIRING BY INKJET
(PROGRESS VIEW)

ORGANIC SUBSTRATE TYPE DOUBLE SIDED ELECTRODE PACKAGE
(BGA TYPE)

(A) UPPER SURFACE VIEW (B) UNDER SURFACE VIEW (C) CROSS-SECTIONAL VIEW OF A-A' : WIREBOND CONNECTION METHOD (D) CROSS-SECTIONAL VIEW OF A-A' : FLIP-CHIP CONNECTION METHOD

IMAGE SENSOR PACKAGE

PACKAGED SEMICONDUCTOR DEVICE AND METHOD OF MANUFACTURING THE PACKAGED SEMICONDUCTOR DEVICE

TECHNICAL FIELD

The present invention relates to a semiconductor package and a manufacturing method of the same, in which a wiring portion located at one side of a substrate is connected to a wiring portion located at the other side at a side surface by an ink jet system by using nano metal particles.

BACKGROUND ART

As the level of integration increases in an LSI chip, the reduction in a package size is also in strong demand, and various mount package structures are proposed. In recent years, developments have been vigorously conducted in attempts to form and laminate a through electrode on a semi-conductor bare chip. At the same time, a double-sided electrode package in real size is likely to be available in the market in the future. No matter whichever technology is employed, the conventional double-sided electrode package is always in need of a through electrode structure, whereas the application of the existing method of insulating a through hole to the mounting process of the semiconductor has been difficult due to high temperature processing. Hence, the formation of through holes on the semiconductor substrate and its insulating method are still fraught with problems, and it is desired to wire without necessitating the through holes.

In the meantime, in recent years, nano metal particles have been developed. The materials include copper, silver, gold, and the like. These fine particles have a great feature in that a direct drawing can be made by the ink jet system. Organic solvent contains the nano metal particles, and by using these particles, a desired pattern is drawn by the ink jet method which is put into a practice by a printer. Noble metals such as silver and gold are by nature hard to be oxidized, whereas copper has a nature easily oxidized comparing with silver and gold. After a wiring pattern drawing, a thermal treatment (to the extent of 200 to 300° C.) is required, in which the organic solvent is vaporized, and further, copper particles are mutually adhered. However, even during the thermal treatment, the surface of copper ends up being oxidized. In the nano metal particles, there is a problem that a ratio of atom of the surface portion is large, and as a result, a wiring resistance becomes high due to the formation of surface oxidized copper.

Further, the thermal treatment alone is unable to sufficiently remove the organic solvent, and this brings about circumstances where it is not possible to reduce electric resistivity of the copper wiring nor is it possible to use the copper wiring as a wiring. With respect to the lowering of an electric resistance after the drawing, there is still no sufficient solution found particularly in the case of copper.

In the technology in which not a direct drawing system such as the ink jet system but lithography mixed with resist is used, a lowering of the resistance of copper has been proposed in various manners, and, for example, Patent Document 1 is known in this respect. Restoration thermal treatment technology used here is performed at the temperatures of 200 to 450° C. in an inert gas (or in vacuum) containing molecular ($H_2$) hydrogen below 4%. Thus, this technology, while using copper fine particles, is not a direct drawing system, and the reduction temperature thereof is high such as 200 to 450° C. When the temperature is high as much as that, it is difficult to use this technology in the mounting area of the semiconductor. Patent Document 1: Japanese Patent Laid-Open No. 2002-75999.

An object of the present invention is to solve such a problem as described above so as to easily manufacture and provide a double sided electrode package without requiring the through electrode technology. As a result, a wafer level type double sided electrode package, a lead frame type double-sided electrode package or an organic substrate type double-sided electrode package (BGA type) can be manufactured, and apart from the application to the conventional mobile phone, can be effectively used as a package for each type of sensors (such as sound, magnetic, and pressure).

Further, the present invention forms a side wiring by the ink jet system using the nano metal particles. Particularly, when copper is used, a problem such as a wiring resistance becoming high by the formation of surface oxidation copper is solved, thereby attempting to lower the resistance after the drawing and enabling the side wiring to be mountable on the semiconductor.

DISCLOSURE OF THE INVENTION

In the semiconductor package and its manufacturing method of the present invention, a first wiring portion located at one side of a substrate and a second wiring portion located at the other side of the substrate are connected by wiring. A side electrode connected to the first wiring portion is formed, and the second wiring portion is formed on an insulating layer formed on the substrate. An exposed end of the second wiring portion, which is formed when completely cut so as to be singulated into individual semiconductor packages, and the side electrode are wired by the ink jet system by using nano metal particles. The nano metal particles which make the wiring by the ink jet system are nano copper metal particles, and the wiring by these nano copper metal particles performs a reduction of the metal surface oxidation film and/or removal processing of organic matters of the wiring by atomic hydrogen.

In the semiconductor package and its manufacturing method of the present invention, there is formed simultaneously a side electrode as well as a post electrode with the same height as the post electrode connected to the first wiring portion at one side of the substrate in which an LSI forming surface and the first wiring portion are located, and arrange the electrodes so as to ride both of a chip end and a scribe line to be exposed when cut into the plurality of individual chips from the wafer. When completely cut into the plurality of individual chips, the side electrode run over the scribe line is also simultaneously cut, so that the side electrode is exposed and formed on the package end surface.

One side of the substrate is formed with an image sensor forming surface, and on that surface, a transparent insulating film is formed, and through this transparent insulating film, a light beam from the outside is allowed to enter a light receiving element area of the image sensor forming surface, so that an image sensor package can be formed.

Further, in the semiconductor package and its manufacturing method of the present invention, a substrate is configured by an organic substrate and a semiconductor chip adhered on that substrate. The first wiring portion includes a side electrode connected to a metal pad portion formed on the uppermost layer of the organic substrate, and seals over the semiconductor chip electrically connected to the wiring pattern of the organic substrate by molded array packaging so as to form an insulating layer, and wires a second wiring portion on this insulating layer. Between an exposed end of the second wiring portion which is formed when completely cut into the plurality of individual semiconductor packages and the side electrode, a wiring is applied by the ink jet system.

Further, in the semiconductor package and its manufacturing method of the present invention, a substrate is constructed by a lead frame and a semiconductor chip adhered on its die pad. The first wiring portion includes an inner lead portion and an outer lead portion of the lead frame, and seals over the semiconductor chip electrically connected to the inner lead portion of the lead frame by molded array packaging so as to form an insulating layer, and wires a second wiring portion on this insulating layer. The outer lead portion for electrically connecting the lead frame to peripheral circuits has its distal end cross-section exposed not only to the lead fame backside, but also to the side surface so as to be a side electrode. Between an exposed end of the second wiring portion which is formed when completely cut into the plurality of individual semiconductor packages and the side electrode, a wiring is applied by the ink jet system.

Advantages of the Invention

According to the present invention, even when the through hole is not formed, the double-sided electrode package is made feasible, and therefore, apart from the application to the conventional mobile telephone, can be effectively used as a package for various sensors (such as sound, magnetic, and pressure).

The present invention can easily manufacture and provide a wafer level type double-sided electrode package without requiring the through electrode technology with a relatively large chip size (for example, 5 mm or more) in the equipment requiring a high density mounting such as a mobile telephone.

Further, according to the present invention, a lead frame type double-sided electrode package or an organic substrate type double-sided electrode package (BGA type) each of which is adaptable even in the field where chip size is small and it is not adaptable at a wafer level is provided, and, for example, is effective for an LSI small in chip size of the processing processor such as a DSP package directly connected to a microphone, a magnetic sensor, and a pressure sensor. As the ordinary lead frame technology can be used, the package can be provided at a lower price.

Further, according to the present invention, since the reduction is performed by the molecular hydrogen (H) resolved by a metal catalyst of a Hot-Wire method under the reduced pressure, its reducing activity is far higher than the molecular hydrogen, and therefore, a reducing temperature is made feasible at much lower temperature. As a result, the present invention is applied to the manufacture of the semiconductor device, and in particular, it is possible to aim at a lowering of the resistance after the wiring is drawn by using copper.

BEST MODE FOR CARRYING OUT THE INVENTION

Figure 1:
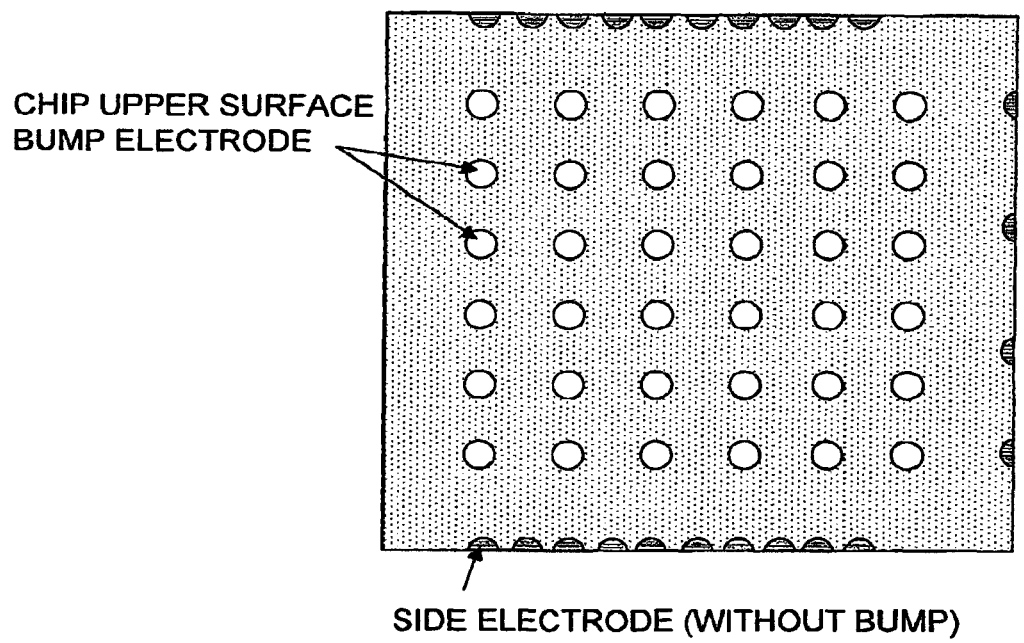
FIG. 1 is a top view and a side view of a chip showing a first example applying a double-sided electrode package of the present invention to a wafer level semiconductor.
Figure 1:
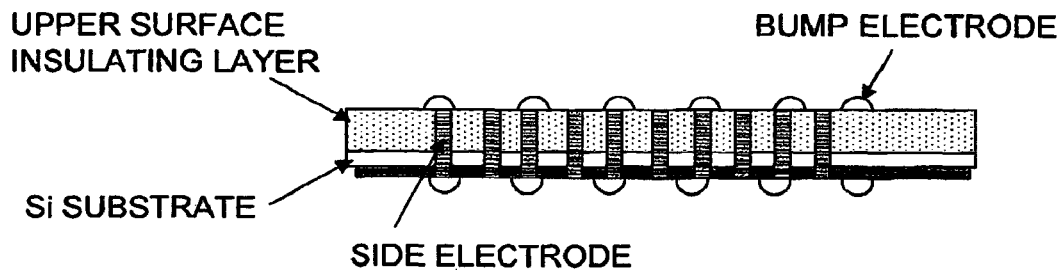
Figure 2:
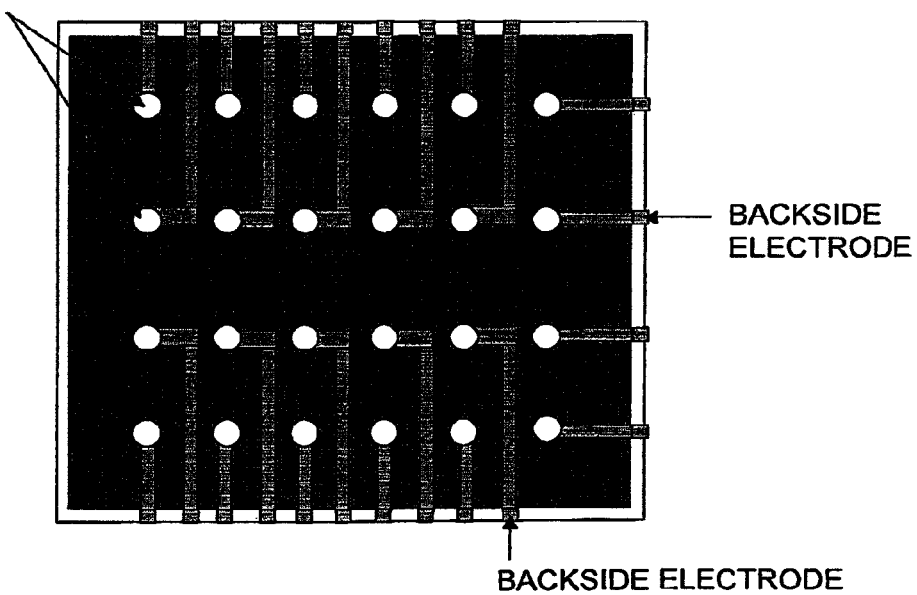
FIG. 2 is a chip backside view and a chip side view showing a first example applying a double-sided electrode package of the present invention to a wafer level semiconductor.
Figure 2:
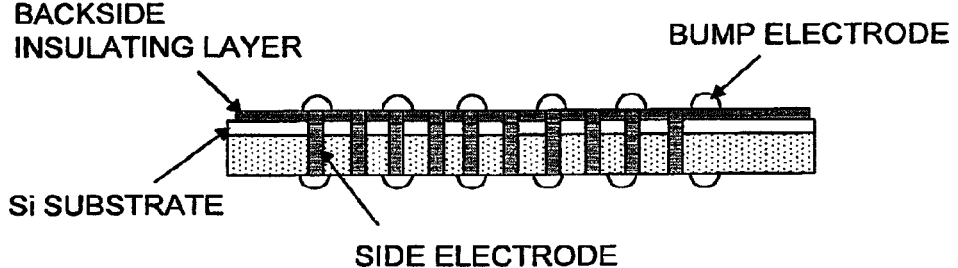

The present invention will be described below based on the illustrated examples. FIGS. 1 and 2 show a top view and a rear side view of a chip respectively showing a first example applying a double-sided electrode package of the present invention to a wafer level semiconductor. In the manufacture of a semiconductor device, after preparing a semiconductor substrate of several hundreds μm in thickness, a circuit (a circuit element) is formed on an LSI forming surface of the upper surface (first main surface) of this semiconductor substrate. Further, on the surface of the semiconductor substrate, a multilayer wiring portion is formed. In the following description, the side on which an LSI formation surface formed on the semiconductor (Si) substrate and the multilayer wiring portion are located is referred to as an upper surface side, and the opposite side is referred to as a backside (second main surface).

The illustrated double-sided electrode package has a feature in the side surface wiring, which connects the upper surface side and the backside. On the upper surface side of the Si substrate, an LSI forming surface and a multilayer wiring portion (LSI upper surface re-wiring) are formed, and further, to be connected to a predetermined position on this LSI upper surface re-wiring, a plurality of cylindrical Cu post electrodes (see FIG. 3) are formed there. This post electrode is covered by an upper surface insulating layer, and its tip end is provided with a bump electrode for external connection.

On the other hand, in the backside of the Si substrate illustrated in FIG. 2, a backside insulating layer is applied. On this backside insulating layer, a backside re-wiring is made. This backside re-wiring is connected to a desired place of the multilayer wiring portion of the upper surface side through the side surface wiring which is the feature of the present invention. This side surface wiring is performed by connecting a side electrode formed on the upper surface side and a backside electrode formed on the backside by the ink jet system, and its details will be described later. On the backside re-wiring, a protection film is applied. Further, the protection film on a bump forming portion on the re-wring is provided with an opening, and the bump electrode is formed there.

Thereby, both surfaces of the upper surface side and the backside are provided with the bump electrode for external connection, so that a stacked semiconductor device is formed, which is usable by being stacked with other semiconductor devices.

Next, the manufacture of such a stacked semiconductor device will be described with reference to FIG. 3, which shows a cross-sectional view cutting the semiconductor device by the post electrode portion. In the manufacture of the semiconductor device, after preparing a semiconductor (Si) substrate of several hundreds µm in thickness, a circuit (circuit element) is formed on an LSI forming surface of the upper surface side of this semiconductor substrate, and further on that circuit, a multilayer wiring portion (re-wiring portion) is formed by means such as lithography and ink jet (illustration omitted). Through this multilayer wiring portion, the post electrode and the side electrode formed as hereinafter described are connected.

On the upper surface side of this semiconductor substrate, to be connected to a predetermined position on the multilayer wiring portion, a plurality of cylindrical Cu post electrodes and side electrodes (see FIG. 1 or 6) having the same height as the Cu post electrode are simultaneously formed, respectively. The side electrode is arranged so as to ride both of a chip end and a scribe line to be exposed when cut into the plurality of individual chips from the wafer.

Figure 3:
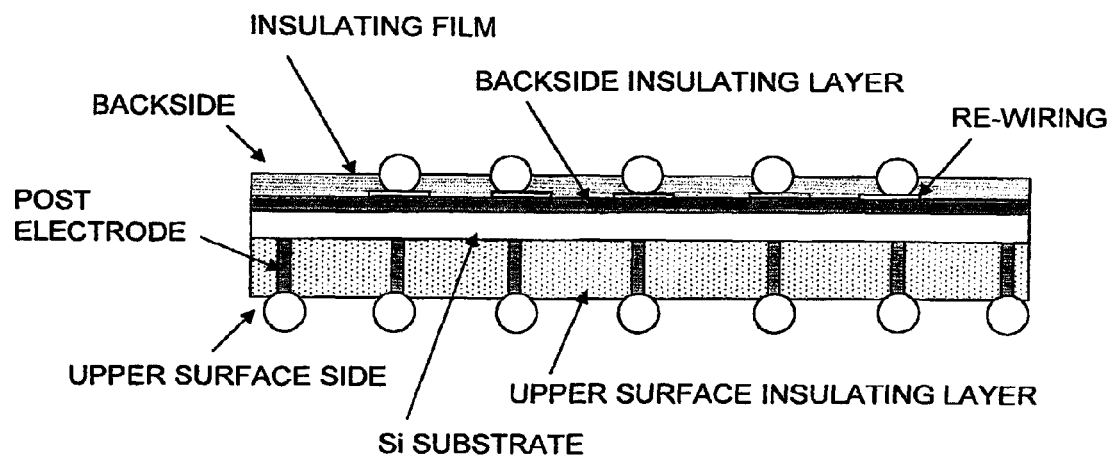
FIG. 3 is a cross-sectional view cutting a semiconductor device by a post electrode portion.

Next, as shown in FIG. 3, on the upper surface of the semiconductor substrate, an upper surface insulating layer is formed. The post electrode is covered by the upper surface insulating layer. The upper surface insulating layer uses an insulative organic resin such as epoxy resin and polyimide resin. The upper surface insulating layer is, for example, formed by a plastic mold (wafer upper surface mold). Next, the surface of the upper surface insulating layer is polished so that the tip end of the post electrode is exposed. When the polishing amount is large, the thickness of the post electrode becomes thin, and the thickness of the upper surface insulating layer also becomes thin.

The side surface wiring to be performed at a later process is performed at the side surface of the silicon substrate by the ink jet system, and for this reason, the silicon substrate is not necessarily ground. However, even when the silicon substrate is, for example, ground to the extent of 100 µm with the upper surface mold surface taken as a support medium so as to make the thickness of the silicon substrate thin, the upper surface insulating layer is thick, and rigidity action is operated, and the strength of the whole wafer can be maintained.

Next, on the backside of the semiconductor substrate, the backside insulating layer is formed. The thickness of the backside insulating layer is made to have a thickness at least to provide electrical insulation. At this stage, with this backside insulating layer up, a chip may be half-cut from a wafer. However, in order that a wiring material crept into a grove formed by a half-cutting at a later process does not makes a short circuit with a silicon substrate, the half-cutting is made only halfway through the backside insulating layer.

Figure 4:
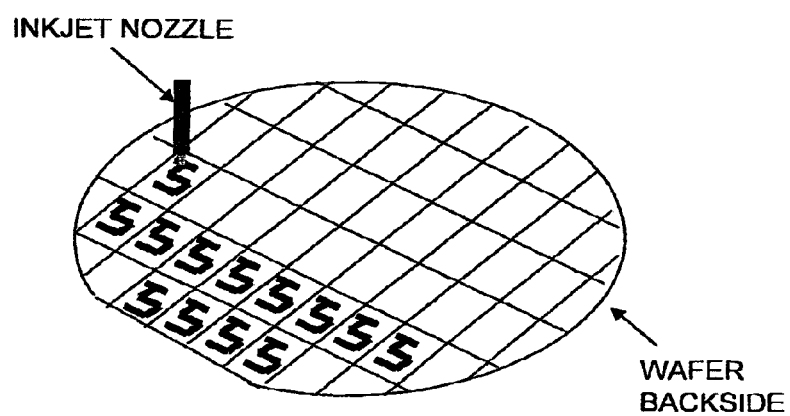
FIG. 4 is a view showing a re-wiring performed by an ink jet by using nano metal particles for the backside of a semiconductor wafer.

Next, on this backside insulating layer, a backside electrode wiring (re-wiring) is applied. This backside electrode wiring is performed by the ink jet system. When the half-cutting is performed, the wiring material creeps also into the groove formed by the half-cutting In the manufacture of the semiconductor device, in general, the semiconductor wafer having a wide area is prepared, and after that, going through each processing, and finally, lengthwise and crosswise cut and separated, large quantities of semiconductor elements (semiconductor chips) are formed. FIG. 4 shows the re-wring performed by the ink jet by using nano metal particles for the backside of this semiconductor wafer. Alternatively, this re-wiring can be performed by screen printing.

Figure 5:
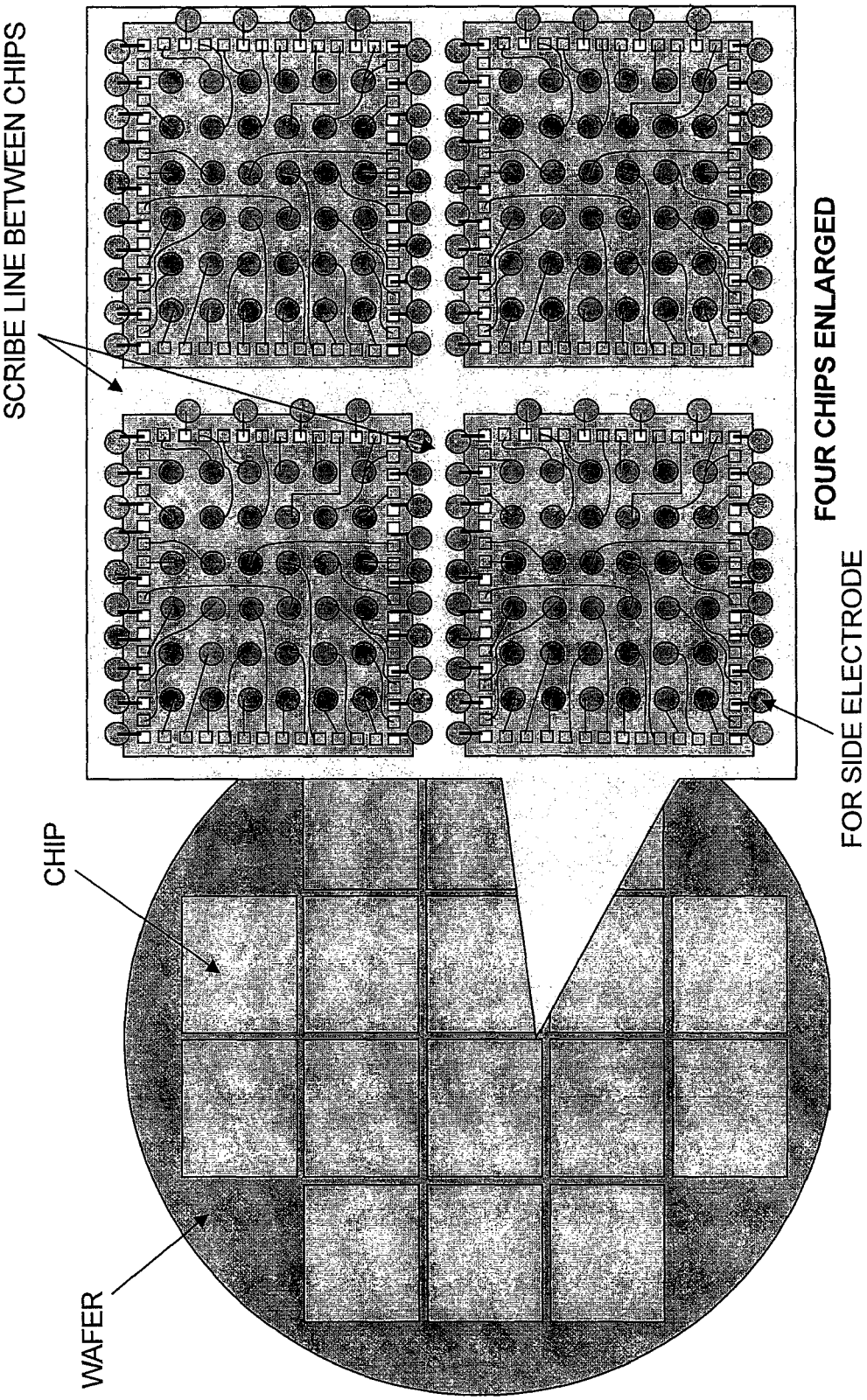
FIG. 5 is a view illustrating the cutting of a chip.

Next, the chip is completely cut. FIG. 5 is a view to explain the cutting of such a chip. On the upper surface of the semiconductor wafer having a wide area, a unit circuit containing a predetermined circuit element is formed. This unit circuit is lengthwise and crosswise arrayed, arranged, and formed on the upper surface of the wafer. After that also, on the wafer level, each processing such as the formation of the post electrode and the side electrode and the formation of the insulating film is performed. Finally, lengthwise and crosswise cut and separated, large quantities of semiconductor elements (semiconductor chips) are formed. The side electrode, as described above, is arranged to ride both of the chip end and the scribe line so as to be exposed when cut into individual chips from the wafer.

FIG. 6 shows a view A showing cutting out of the chip in a completely cut state when a half-cutting is performed, and a completion drawing B in which a side surface wiring is applied after insulation is given to the whole surface of a silicon substrate cut side surface. FIG. 7 shows, similarly to FIG. 6, a view A showing cutting out a chip in a completely cut state, and a completion drawing B in which a wiring is applied on the side surface after insulation. In addition, the figure shows a chip in a completely cut out state without performing a half-cutting. FIG. 8 shows, similarly to FIG. 7, a view A applying insulation of a silicon substrate cut side surface to a necessary place only, and a completion drawing B after the wiring applied on the side surface.

Figure 6A:
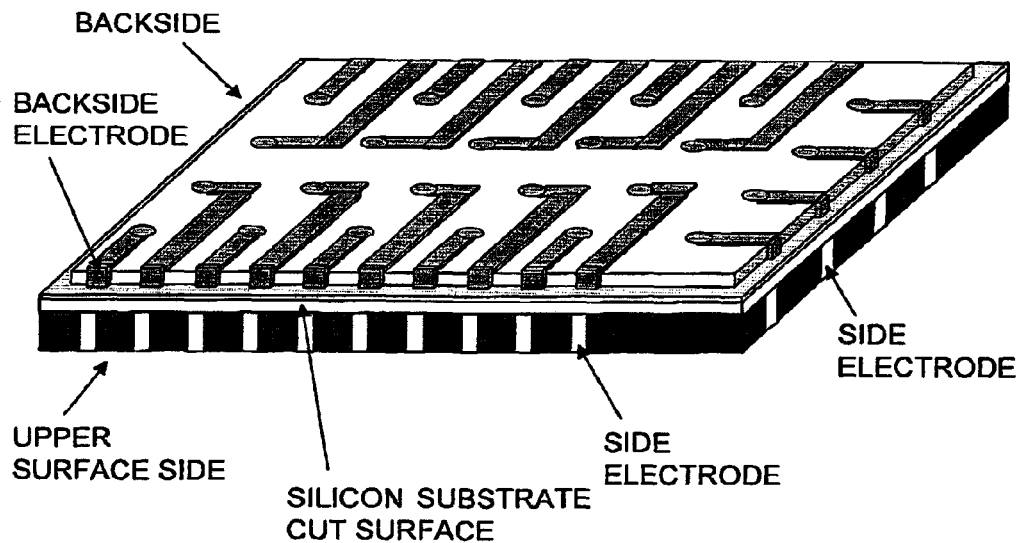
FIG. 6 shows a view A showing cutting out a chip in a completely cut state when a half-cutting is performed, and a completion view B in which a wiring is applied on a side surface after insulation is given to the whole surface of a silicon substrate cut side surface.

When the half-cutting is performed as shown in FIG. 6, the teeth of the blade narrower than the case of the half-cutting at the time of complete cutting are used. Further, as shown in FIGS. 7 and 8, the substrate can be completely cut into individual chips without performing the half-cutting. In either case, when the substrate is completely cut, the side electrode run off to the scribe line is also simultaneously cut, and the side electrode is exposed on the chip end face. A backside electrode means an end face (see FIGS. 7A and 8A) of a backside electrode wiring (re-wiring) exposed by cutting, and also means an electrode portion (see FIG. 6A) formed by the entrance of the wiring material into a groove formed by the half-cutting.

Figure 6B:
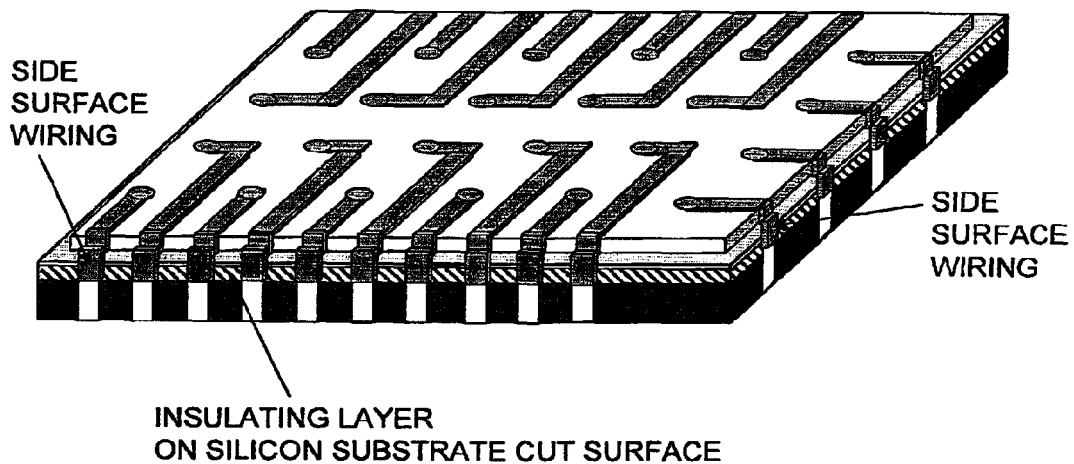
Figure 7A:
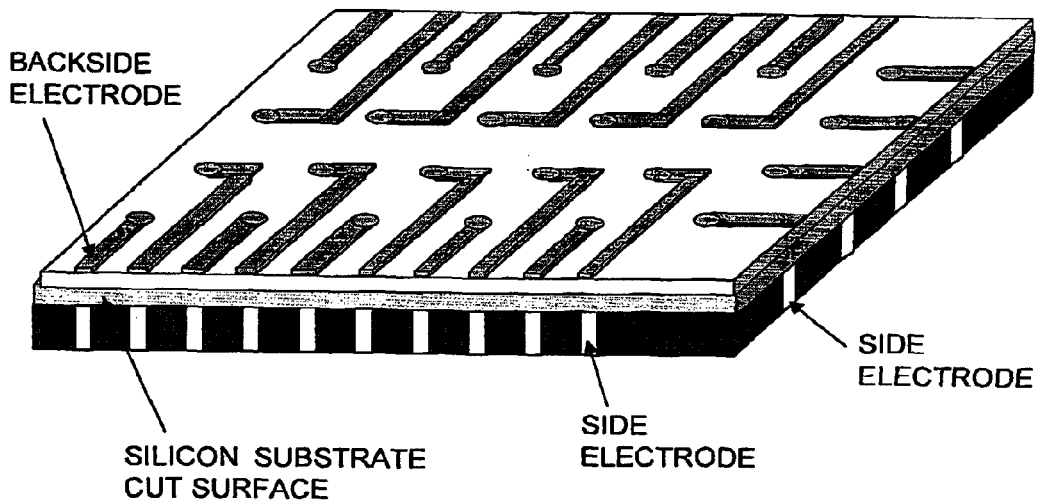
FIG. 7 shows, similarly to FIG. 6, a view A showing cutting out a chip in a completely cut state without a half-cutting performed, and a completion drawing B in which a wiring is applied on the side surface after insulation.
Figure 7B:
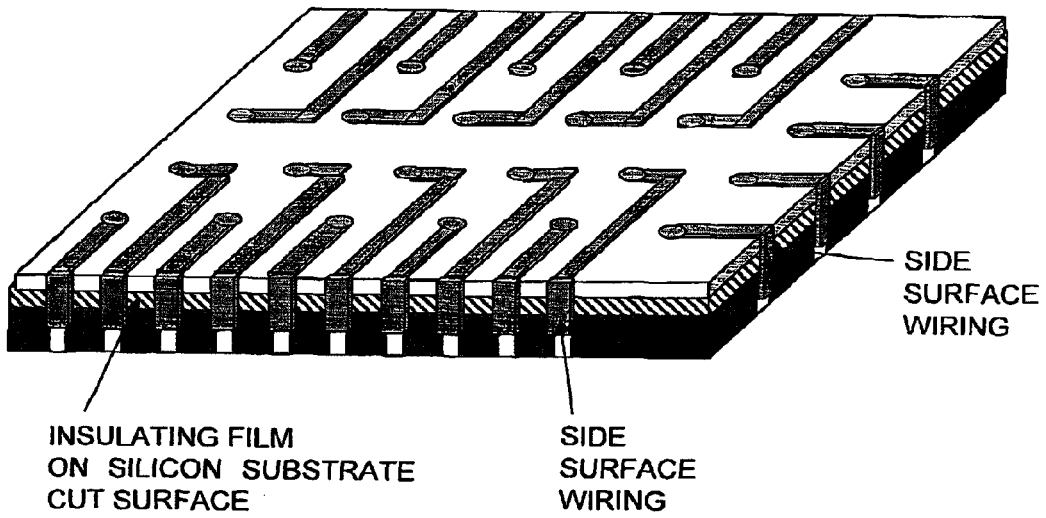
Figure 8A:
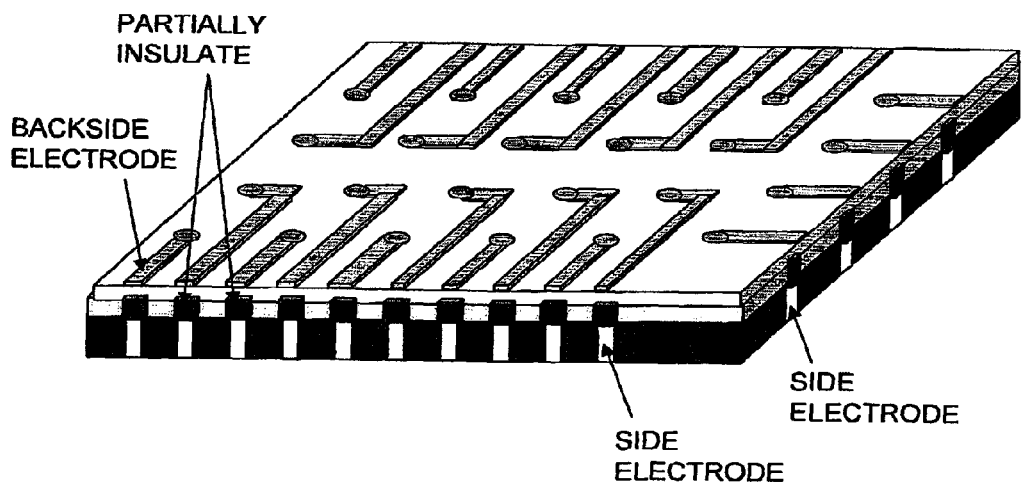
FIG. 8 shows, similarly to FIG. 7, a view A applying insulation of a silicon substrate cut side surface to a necessary place only, and a completion drawing B after the wiring applied on the side surface.
Figure 8B:
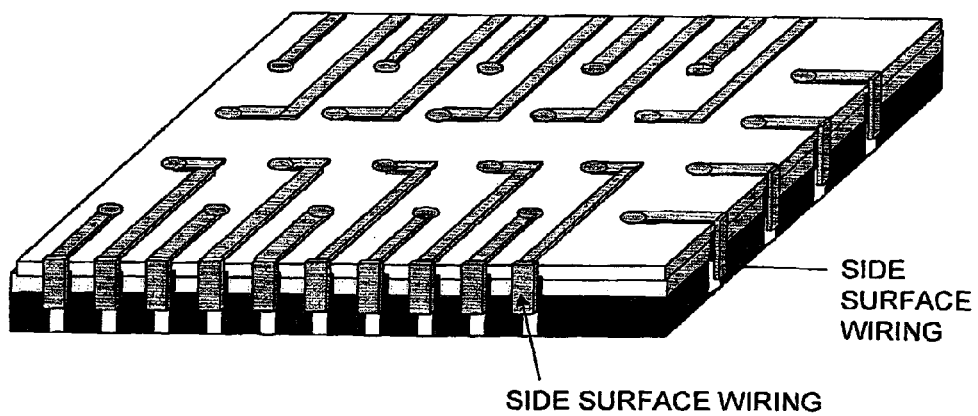

In each case shown in FIGS. 6 to 8, after the chip is cut out, before performing the side wiring, the silicon substrate cross-section is insulated. This insulation, as shown in FIG. 6B or 7B, can be performed by forming an insulation film on the whole surface of the silicon substrate cut side. Alternatively, as shown in FIG. 8A, the insulation film can be partially formed on the portion only in which a side wiring is performed later. These insulation films, for example, are formed with the insulation material (for example, epoxy system resin) coated by the ink jet system.

In each case shown in FIGS. 6 to 8, after the silicon substrate side is insulated, the side wiring is applied. This side wiring is performed by connecting the side electrode formed on the chip top side and the back electrode formed on the chip backside by the ink jet system using the nano metal particles.

The ink jet system performing the side wiring employs, the metal of low resistance such as gold, silver, platinum, paradigm, tungsten, nickel, tantalum, bismuth, lead, indium, tin, zinc, titanium or aluminum in addition to the nano metal particles, for example, copper. Particularly, contamination and oxide by organic solvent of the copper wiring formed by the ink jet system using the nano metal particles are removed at low temperatures above the room temperature and below 200° C. The detail thereof will be described later. A solder resist is coated on the chip side and the backside re-wiring.

Next, on the backside and the top, respectively, bump electrodes are formed. In each of the backside and the top, the insulating film on the bump forming portion is provided with an opening, and the bump electrode is formed there. The bump electrode formed on the top and the backside respectively are, for example, a bump electrode by a solder ball, a gold ball, a copper ball with its surface gold-plated and the like, a protruding electrode by screen printing and heating or an electrode by a convex formation by the ink jet, and the like.

The semiconductor device as described above has been described with a bare chip laminated structure comprised of the bump electrode for external connection on both of the top and the backside as an example. Such a semiconductor device can be laminated with another semiconductor device on the top and/or the underside. The alignment of the semiconductor devices to be laminated is performed so as to be superposed in connecting portions, and put into a furnace, the protruded electrodes of the connecting portions are temporarily heated and fused so as to be joined. By this laminated fixing, stacked semiconductor devices can be manufactured.

Figure 9:
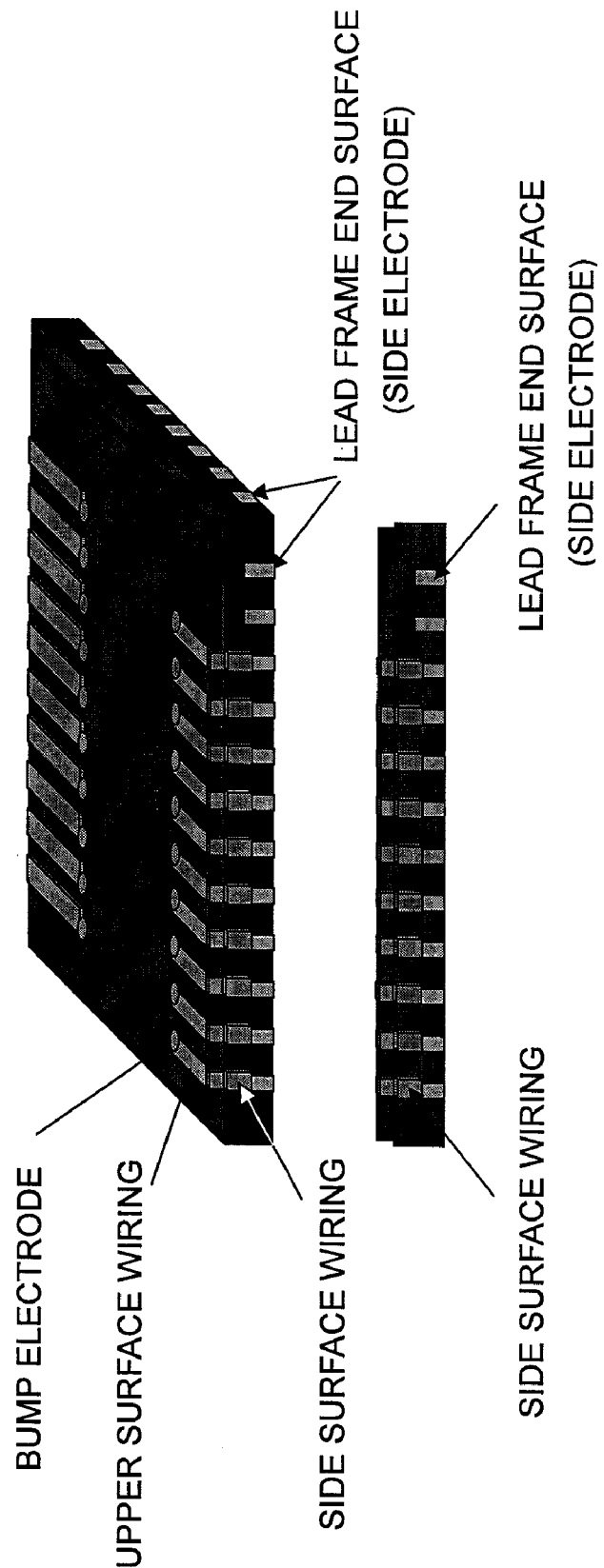
FIG. 9 is an oblique view and a side view showing a second example applying the double-sided electrode package of the present invention to a lead frame.

FIG. 9 shows an oblique view and a side view showing a second example applying the double-sided electrode package of the present invention to the lead frame type double-sided electrode package. Incidentally, in the lead frame type double-sided electrode package, the semiconductor chip side located on the lead frame is referred to as a face side, and a lead frame side in opposite to the chip side is referred to as an underside. The illustrated lead frame type double-sided electrode package has features in the side wiring which connects the face side wiring and the tip end of the lead frame exposed to the side. The side wiring for the lead frame end face (side electrode) and necessary places between the wirings of the face side is performed by the ink jet system. The solder resist is coated on the side and the face side and the bump electrode for external connection is formed. Hereinafter, this lead frame type double-sided electrode package will be further described.

Figure 10:
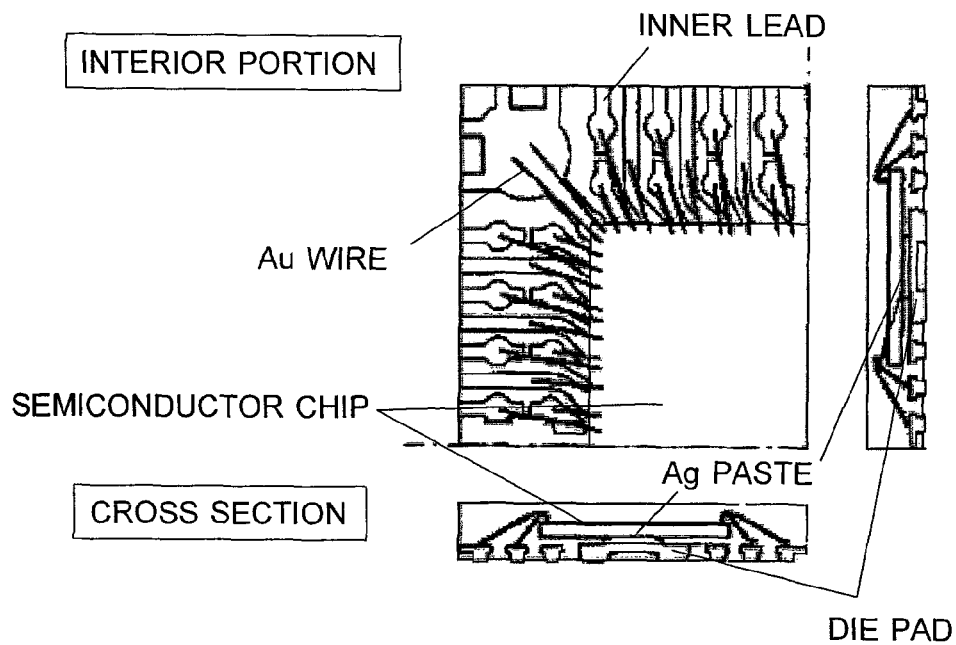
FIG. 10 is a view showing an inner portion and a cross-section of the lead frame.
Figure 11:
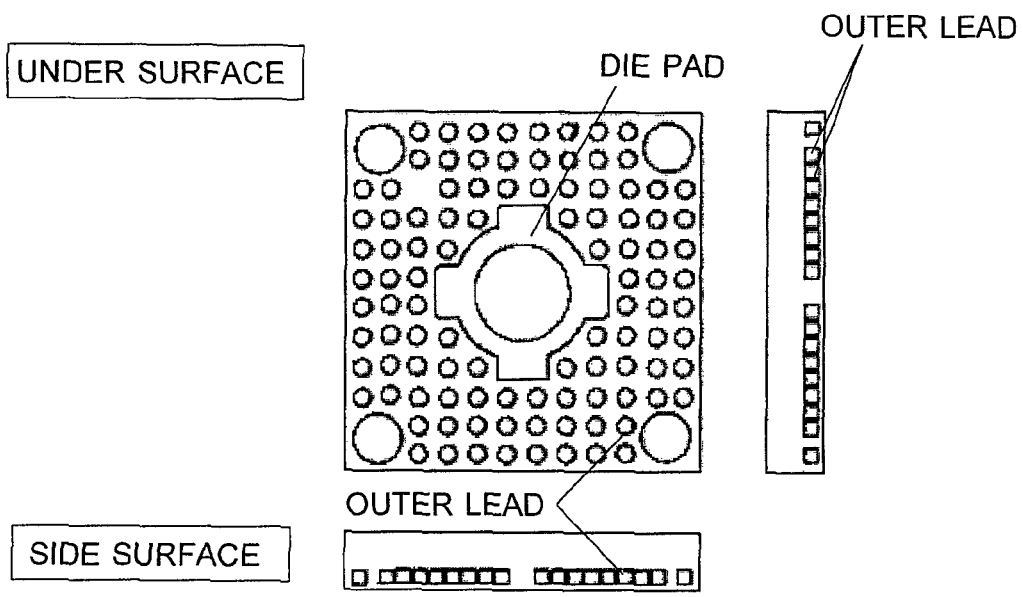
FIG. 11 is a bottom view and a side view of the lead frame.
Figure 12:
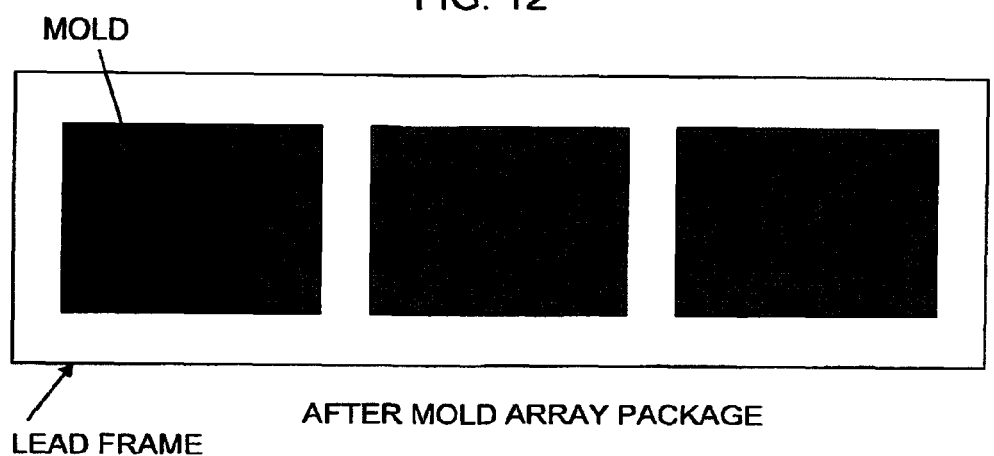
FIG. 12 is a view illustrating the lead frames in a state after being mold-array-packaged in an island shape.

FIG. 10 is a view showing the interior and the cross-section of the lead frame. FIG. 11 shows the bottom view and the side view of the same lead frame. As shown in the drawings, the semiconductor chips are adhered on a die pad by Ag paste (die bond) and the like. While one piece of the semiconductor chip is illustrated, a plurality of chips can be laminated. Inner leads of the lead frame and the semiconductor chip are connected by Au wire (wire bond) or can be connected by flip chip bond. Outer lead portions for electrically connecting this lead frame to peripheral circuits have the tip end sections exposed not only to the lead frame underside, but also to the side. After the wire bonding, the lead frames are sealed by epoxy resin to be protected from external stress and contamination. FIG. 12 illustrates the lead frame in a state subjected to the molded array packaging in an island shape.

Next, the half-cutting (recess or V form cutting) is perform for singulation of chips. For example, a plurality of chips are simultaneously formed from a metal sheet such as Cu alloy treated with Pd plating.

Figure 13:
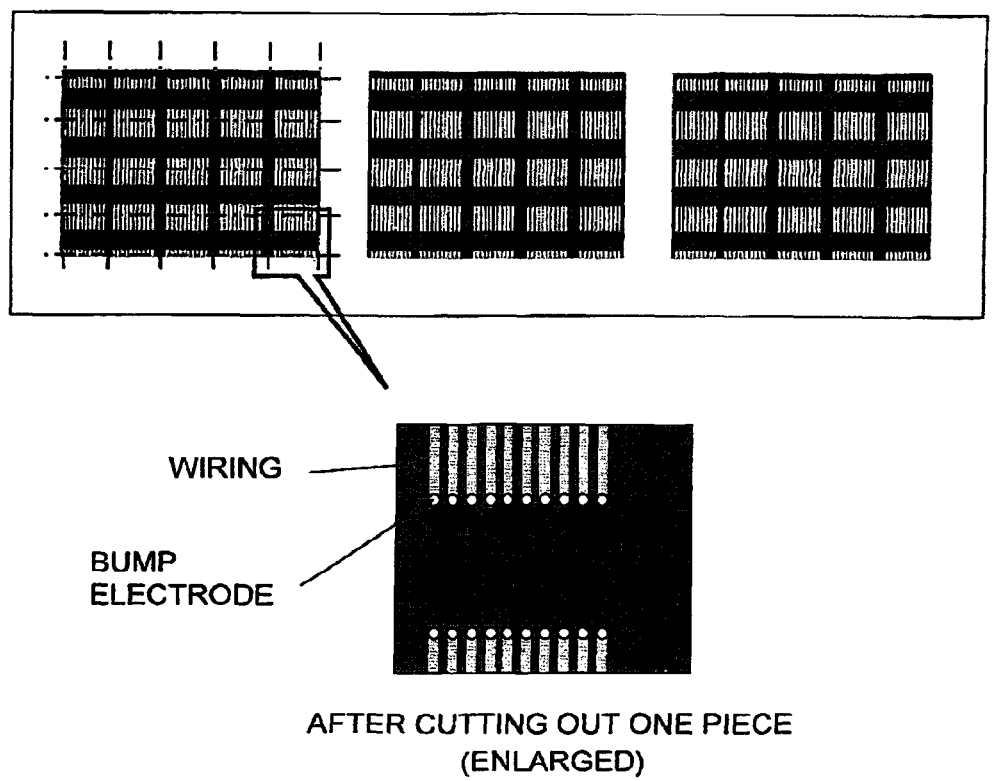
FIG. 13 is a view of the wiring and a bump electrode formed on a mold face.

Next, as shown in FIG. 13, a mold face is formed with the wiring and the bump electrode (the formation of the bump electrode may be performed later). This wiring is performed by the ink jet system or the screen printing. Further, this wiring is configured to have a part thereof drawn to the half-cutting portion (the groove formed inside) of the side, so that the subsequent wiring connection to the lead frame end face (side electrode) becomes easy.

Figure 14:
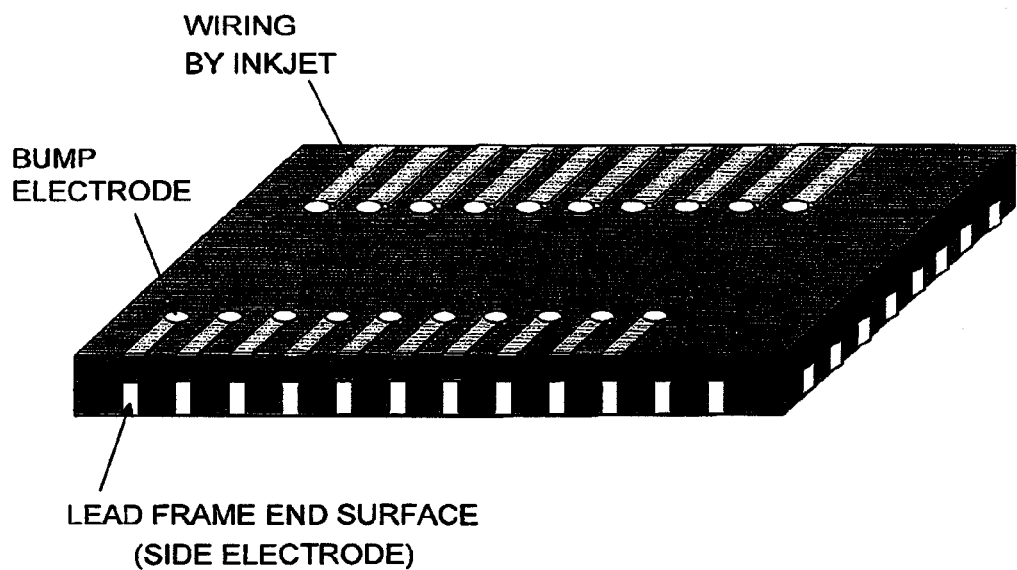
FIG. 14 is a view illustrating a lead frame package in a cut state.

Next, the chip is completely cut. The teeth of the blade at this time use the teeth narrower than the half-out previously described. FIG. 14 illustrates the lead frame package in a cut state. A space between the lead frame end face (side electrode) and the wiring of the face side is not yet connected.

Figure 15:
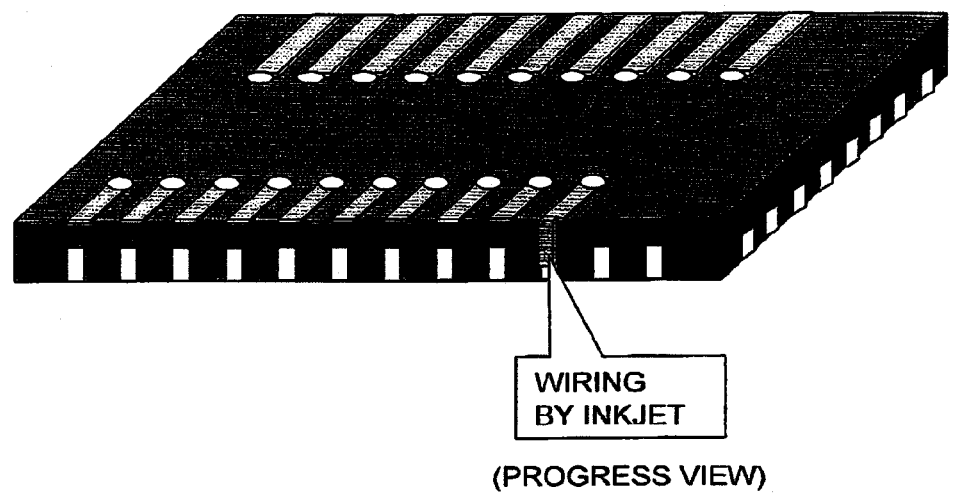
FIG. 15 is a view of the progress in which one piece wiring only is completed.

Next, as shown in FIG. 15, by the ink jet system using the nano metal particles, in particular, the nano copper metal particles, the side wiring for the necessary places is performed. The detail of the removal of contamination and oxide by organic solvent of the copper wiring formed by the ink jet system using the nano copper metal particles will be described later. FIG. 15 shows a progress view in which only one piece of wiring is completed. After the completion of the wiring, the side and the face side are collated with solder resist. At this stage, the bump formation area is opened, and the bump electrode can be also formed.

Figure 16:
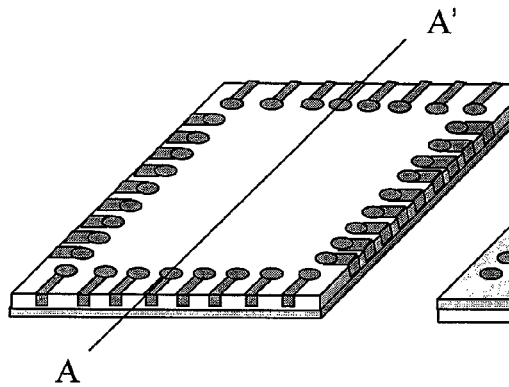
FIG. 16 is an oblique view and a cross-section showing a third example applying the double-sided electrode package of the present invention to the organic type substrate.
Figure 16:
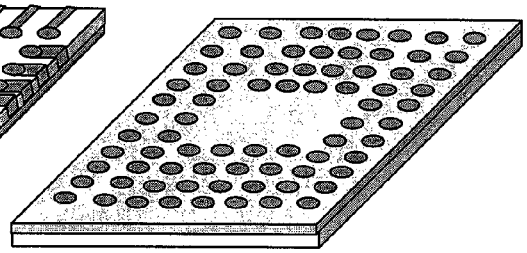
Figure 16:
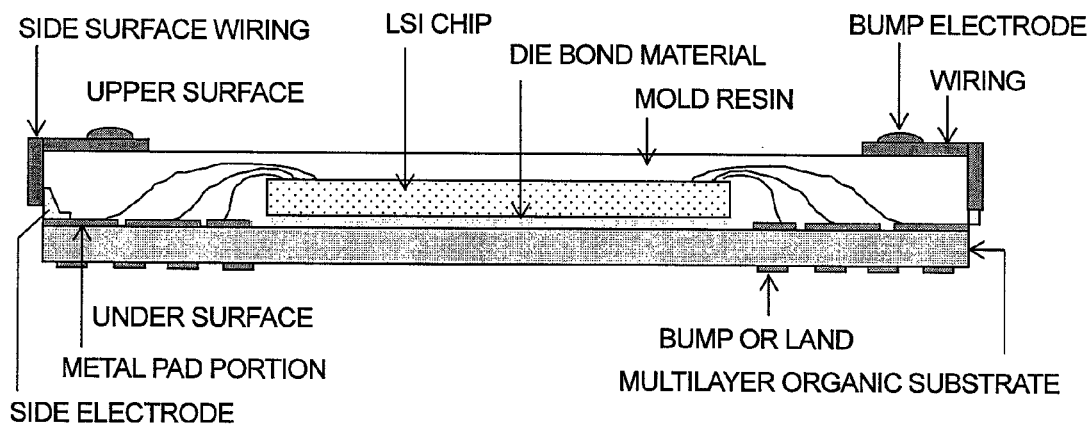
Figure 16:
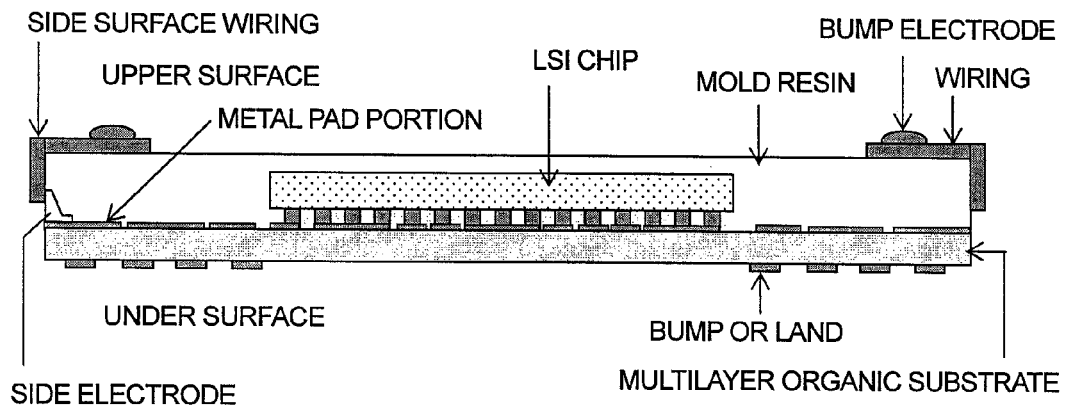

FIG. 16 is an oblique view and a cross-sectional view showing a third example applying the double-sided electrode package of the present invention to an organic substrate type. FIG. 16 illustrates the double-sided electrode package of the BGA type using a multilayer organic substrate. FIG. 16A shows a face side view, FIG. 16B a bottom view, FIG. 16C a cross-sectional view cut along the line A-A' in FIG. 16A regarding the wire-bond connection system, and FIG. 16D, while being the same as FIG. 16C, shows a cross-sectional view of the flip-chip connection system, respectively. Incidentally, in the organic substrate type double-sided electrode package, the semiconductor chip side located on the organic substrate is referred to as a face side and the organic substrate side opposite to the chip side is referred to as a underside.

As shown in the cross-sectional view of the wire-bond connection system of FIG. 16C, the LSI chip is adhered on the multilayer organic substrate by insulative die bond material (chip die bond). Although only one LSI chip is shown, a plurality of chips can be also laminated.

The multilayer or single layer organic substrate forms a wire pattern on each layer comprising a single layer or a plurality of layers, and after that, these substrates are glued together, and are formed with through holes to connect the wiring pattern of each layer according to need. Inside the through holes, a conductive layer is connected to a land which is an end face electrode formed on the underside. That is, the conductive layer of the through hole does not necessary become a land as it is. Further, this land can be formed with a bump for external connection by attaching a soldering material. Such multilayer or single layer organic substrate is, for example, publicly known as a ball grid array (BGA) organic substrate in which a wad (bump) of a small soldering material referred to as [soldering ball] is mounted on the bottom of the substrate.

The wiring pattern on the uppermost layer of the multilayer or single layer substrate is formed with a metal pad potion serving as a bonding wire connection electrode, and is also formed with the wiring to this electrode. The metal pad portion on the upper surface of the multilayer or single layer organic substrate and the LSI chip, similarly to the lead frame type described with reference to FIG. 10, is connected by the Au wire (wire bond).

Alternatively, as shown in FIG. 16D, the LSI chip can be flip chip bonded. In this case, the LSI chip is connected through the wiring pattern of the uppermost layer of the multilayer or single layer organic substrate.

In the configuration shown in FIG. 16C or 16D, at the most external side position of the multilayer organic substrate, the side electrode is connected to the metal pad portion formed on the upper most layer of the multilayer or single layer organic substrate. The side electrode can be formed by a stud bump or a ball bond. Conventionally, a technique has been known, in which a protruded bump (stud bump) is formed on the electrode of the semiconductor chip, and this bump is directly connected to the electrode formed on a mounting substrate. The present invention can form the stud bump as the side electrode by using such publicly known per se technique. Alternatively, similarly to the publicly known per se technique, for example, the tip end of wire such as gold is heated and fused, thereby forming a ball, and after that, the ball is thermally compressed to the metal pad portion concomitantly with ultrasonic wove, and after that, the wire is cut so as to mount it as a side electrode. These side electrodes are allowed to run off to the cut area of the organic substrate similarly to the wafer level semiconductor, and are arranged at a position in which its cut face is exposed at the cutting time.

After the side electrode is connected, similarly to the case of the lead frame described with reference to FIG. 12, the chip is sealed with epoxy resin to be prevented from external stress and contamination. Next, similarly to the case of the lead frame descried with reference to FIG. 13, the wiring and the bump electrode are formed on the mold face(formation of the bump electrode may be performed later). This wiring is formed by the jet ink system or the screen printing.

Next, the chip is cut to be singulated. Incidentally, after the sealing by epoxy resin and prior to the wiring, the half-cutting (recess or V form cutting) for chip singulation can be also performed. As a result, a part of the wiring is configured to run off to the half cut portion (inside the groove formed) of the side so that the subsequent connection to the side electrode is made easy.

Next, after the chip is completely cut, similarly to the case of the lead frame, the side wiring for the necessary places is performed by the ink jet system by using the nano metal particles, particularly, the nano copper metal particles. After the wiring is completed, the solder resist is coated on the side and the face. At this stage, the bump is opened, and the bump electrode can be also formed.

Figure 17:
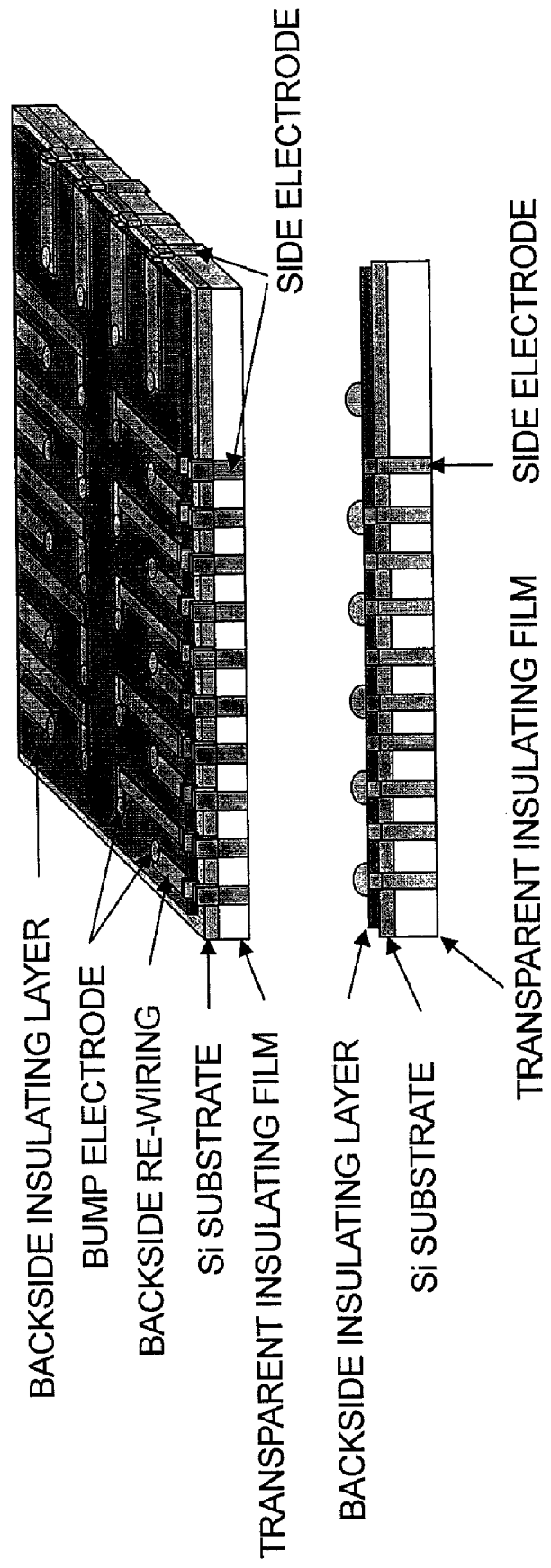
FIG. 17 is an oblique view and a cross-section showing a third example applying the double-sided electrode package of the present invention to an image sensor package.

FIG. 17 shows an oblique view and a side view showing a fourth example applying the double-sided electrode package of the present invention to an image sensor package. Such an image sensor package is, for example, a package for an image sensor LSI, an infrared ray sensor, a temperature sensor LSI, and the like.

The upper surface of the semiconductor (Si) substrate is formed with an image sensor formation surface. The image sensor formation surface is such that a CMOS circuit element comprising a sensor or a light receiving element such as CCD and the like and a control portion controlling the light receiving element are formed by a multilayer wiring, and a predetermined wiring layer inside the multilayer wiring portion is connected to the side electrode. Further, a transparent insulating film is formed on the upper face of the semiconductor substrate. Through this transparent insulating film, the light from the outside can enter a light receiving element of the image sensor formation area.

The configuration of the chip backside can be made similarly to the first example described with reference to FIGS. 1 to 8. That is, in the backside of the Si substrate is coated with a backside insulating layer. On this backside insulating layer, a backside re-wiring is applied. This backside re-wiring is connected to a desired place of the multilayer wiring portion on the upper surface side through the side wiring which is the feature of the present invention. On this backside re-wiring, a protection film is coated. Further, a protective film on the bump forming portion on the re-wiring is provided with an opening, and the bump electrode is formed there.

The present invention employs the nano metal particles, and contamination and oxide by the organic solvent of the copper wiring formed by the jet ink system, particularly using the nano copper metal particles are removed at the temperatures above the room temperature and at the low temperature below 200° C. This will be described below.

(1) The copper wiring is formed by the ink jet system.

In the organic solvent, the nano copper metal particles are contained, and by using these particles, a desired pattern is drawn by the ink jet system which is practically used for a printer. After that, the thermal treatment evaporating the organic solvent is performed.

The present invention removes contamination and oxide due to the organic solvent for the copper wiring formed in such a manner. When the thermal treatment to evaporate the organic solvent is performed, copper oxide is formed by the surface oxidation of copper. However, this can be also removed by the subsequent atomic hydrogen treatment. Alternative, the present invention can be also applied to the case where the thermal treatment to evaporate the organic solvent is not performed. When the thermal treatment is not performed, the copper wiring is in a state of containing the organic solvent. However, by the atomic hydrogen treatment performed subsequently, the organic solvent can be also removed.

(2) Next, in a copper wiring cleaning device, copper oxide and organic solvent contaminated wastes are removed by atomic hydrogen or decomposition species of ammonia.

Figure 18:
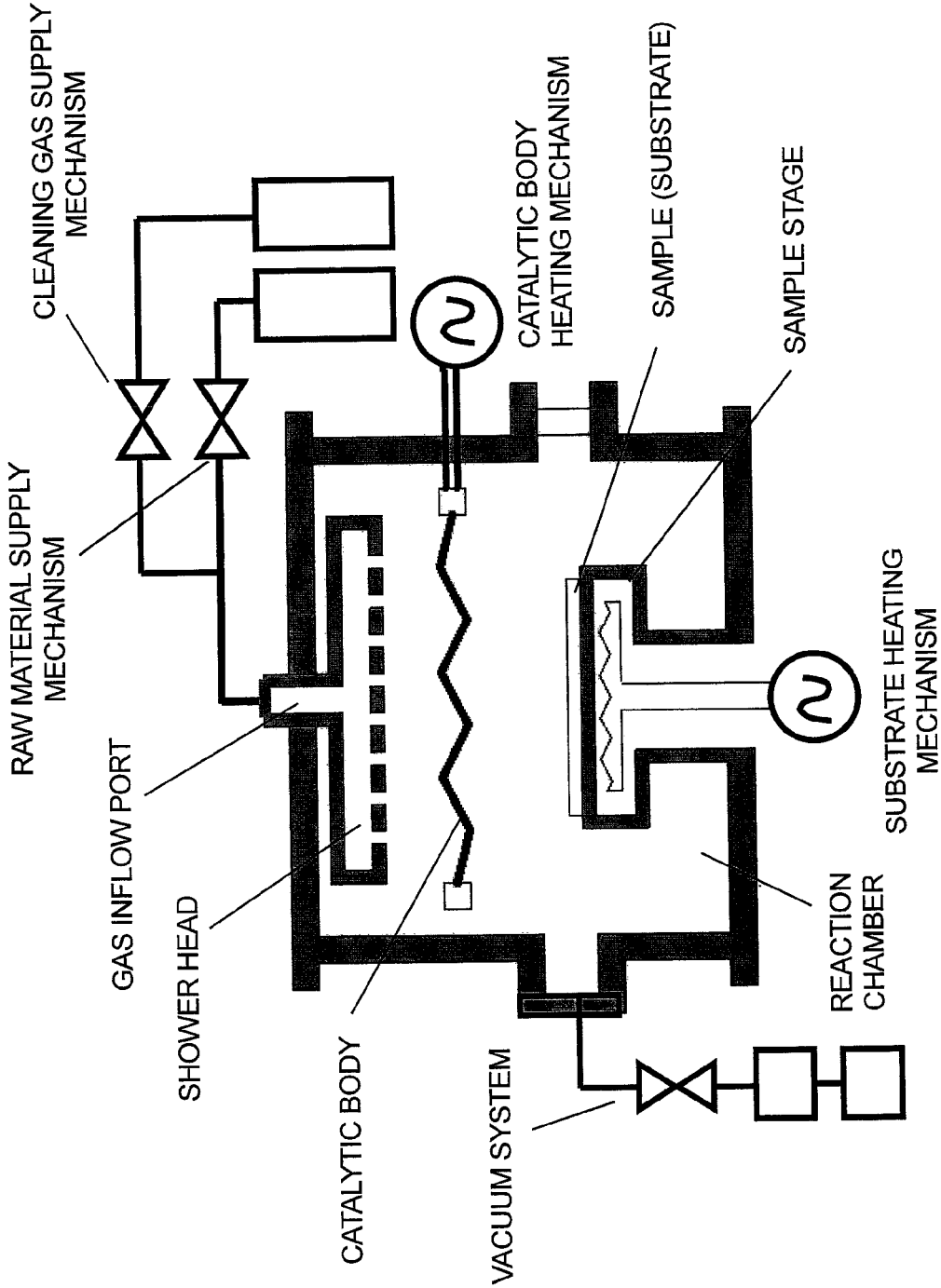
FIG. 18 is a schematic view of a cross-section of a processing device used as a copper wiring cleaning device.

FIG. 18 is a block diagram of the cross-section of a processing device used as a copper wiring cleaning device. From a gas inflow port on the upper surface of a reaction chamber, the material containing hydrogen such as hydrogen, ammonia, and hydrazine as the material of atomic hydrogen or decomposition species of ammonia are fed through a cleaning gas supply mechanism.

Directly below the reaction chamber, a substrate heating mechanism such as heater is provided, and on a sample stage inside the reaction chamber directly above this heating mechanism, a sample (substrate) is placed with an adhered surface directed upward. At the midpoint of a shower head to diffuse a gas from the gas inflow port and the sample, for example, a catalytic body comprising a tungsten wire is placed, and this catalytic body is heated up to high temperatures by a catalytic body heating mechanism, thereby to decompose an inflowing gas. As a result, atomic hydrogen or decomposition species of ammonia are generated by catalytic destruction reaction with heated catalyst. Oxide of the copper wiring is removed by the reduction of atomic hydrogen, and organic contaminant is removed by the formation of hydrocarbon by reactions between atomic hydrogen and carbon.

As chemical compounds containing the above described hydrogen which is the material of atomic hydrogen or decomposition species of ammonia, chemical compounds also containing nitrogen, for example, ammonia, hydrazine can be used. In this case, a gaseous compound is brought into contact with the heated catalytic body, so that atomic nitrogen is generated simultaneously with atomic hydrogen, and together with the reduction of the metal surface oxide film by atomic hydrogen and/or the removal of organic matters, nitriding processing of the metal surface can be performed by atomic nitrogen.

As a catalytic body material, in addition to the tungsten described above, any one material from tantalum, molybudenum, panadium, rhenium, platinum, thorium, zirconium, yttrium, hafnium, palladium, iridium, ruthenium, iron, nickel, chrome, aluminum, silicon, and carbon, oxides of simple substances of these materials, nitrides of simple substances of these materials, carbides of simple substances of these materials (except for carbon), oxide of mix crystal or chemical compounds comprising two types or more selected from these materials, nitride of crystal or chemical compounds comprising two types or more selected from these materials or any one of crystal or carbide of the chemical compounds comprising two type or more selected from these materials (except for carbon) can be used. Further, the temperature of the catalytic body is, for example in the case of tungsten catalytic body, suitable in the range of 1000° C. to 2200° C.

Incidentally, a material supply mechanism in FIG. 18 is, for example, for supplying hexamethyldisilazane, silane, and the like used to deposit a SiN system film. Further, a vacuum system is for exhausting a reaction residual gas.

Using such a copper wiring cleaning device, a wafer, a substrate and the like formed with a patterning wiring or a side wiring using the nano copper metal particles are installed on the sample stage as a sample (substrate). To remove contamination by the wiring using the nano copper metal particles, a hydrogen gas is let inflow for ten minutes at a flow rate of 30 sccm, and by this processing, contamination is removed.

The invention claimed is:

1. A semiconductor package connecting a first wiring portion located on one side of a substrate and a second wiring portion located on the other side of the substrate, the semiconductor package comprising:

a post electrode and a side electrode connected to the first wiring portion, said post electrode comprising a side wall, said side wall of said post electrode being covered by a first insulating layer, said first insulating layer having a first insulating end surface, said side electrode being exposed on said first insulating layer end surface; and a second insulating layer formed on a substrate, on which the second wiring portion is formed, wherein an exposed end of said second wiring portion formed when completely singulated into individual semiconductor packages and said side electrode are wired by an ink jet system using nano metal particles, wherein a side wire connects said exposed end of said second wiring portion and said side electrode, said side wire comprising said nano metal particles, wherein said side electrode is made the same height as said post electrode connected to the first wiring portion at one side of the substrate in which an LSI formation surface and said first wiring portion are located, and is formed simultaneously with the post electrode, and moreover, is arranged so as to ride over both of a chip end and a scribe line so as to be exposed when cut into individual chips from a wafer, and when the chip is completely cut so as to be singulated into individual semiconductor packages, the side electrode which runs off to the scribe line is also simultaneously cut, so that the side electrode can be exposed and formed on the package end surface.

2. The semiconductor package according to claim 1, wherein said nano metal particles for a wiring by the ink jet system are nano copper metal particles, and the wiring by the nano copper metal particles is performed by a reduction of the metal surface oxidation film and/or removal processing of organic matters of the wiring by atomic hydrogen.

3. The semiconductor package according to claim 1, wherein one side of a substrate is formed with an image sensor formation surface and a transparent insulating layer on that surface, and the light from the outside is allowed to enter a light receiving element area of the image sensor formation surface through the transparent insulating film, thereby configuring an image sensor package.

4. The semiconductor package according to claim 1, wherein a portion of said side electrode is embedded in said first insulating layer such that an outer surface of said side electrode is aligned with said first insulating end surface, said outer surface of said side electrode forming a continuous portion of said first insulating end surface, said first insulating end surface being substantially perpendicular to at least a portion of said first wiring portion and at least a portion of said second wiring portion.

* * * * *